(12) United States Patent
Chen et al.

(10) Patent No.: US 12,332,295 B2
(45) Date of Patent: Jun. 17, 2025

(54) WAFER INSPECTION SYSTEM

(71) Applicant: CHROMA ATE INC., Taoyuan (TW)

(72) Inventors: Wei-Chih Chen, Taoyuan (TW);
Shen-Hao Tsai, Taoyuan (TW); Yi-Yen Lin, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 169 days.

(21) Appl. No.: 18/129,907

(22) Filed: Apr. 3, 2023

(65) Prior Publication Data

US 2024/0219447 A1    Jul. 4, 2024

(30) Foreign Application Priority Data

Dec. 30, 2022    (TW) ................. 111214657

(51) Int. Cl.
*G01R 31/26* (2020.01)
*G01R 1/067* (2006.01)

(52) U.S. Cl.
CPC ..... *G01R 31/2601* (2013.01); *G01R 1/06716* (2013.01); *G01R 1/06761* (2013.01)

(58) Field of Classification Search
None
See application file for complete search history.

(56) References Cited

U.S. PATENT DOCUMENTS

| 8,975,904 | B2* | 3/2015 | Yamada | G01R 31/2887 |
| | | | | 324/750.16 |
| 11,609,261 | B2* | 3/2023 | Chen | G01R 31/2887 |
| 2012/0062258 | A1* | 3/2012 | Yamada | G01R 31/2887 |
| | | | | 324/750.16 |
| 2015/0168528 | A1* | 6/2015 | Kang | G01R 31/2889 |
| | | | | 324/537 |
| 2022/0034956 | A1* | 2/2022 | Chen | G01R 31/2889 |

FOREIGN PATENT DOCUMENTS

| CN | 212967612 U | * | 4/2021 | ......... G01N 21/9501 |
| TW | M603962 U | * | 11/2020 | ............. G01R 31/28 |

OTHER PUBLICATIONS

English translation of TW-M603962-U Published Nov. 11, 2020 (Year: 2020).*
English translation of CN-2129676-U Published Apr. 13, 2021 (Year: 2021).*

* cited by examiner

*Primary Examiner* — Jermele M Hollington
(74) *Attorney, Agent, or Firm* — WPAT, PC

(57) ABSTRACT

A wafer inspection system includes a carrier device, a probe card, a first metal kit and a surround separating unit. The probe card includes a detection portion and a conductive layer surrounding the detection portion and disposed on its bottom surface. The first metal kit is configured at a bottom portion of the probe card and coupled to the conductive layer and includes a first window for the detection portion to extend out and a first ring piece extending from a periphery of the first window. The surround separating unit includes a conductive wraparound body surrounding and laterally enclosing the detection portion and a wafer to be inspected during probing. The probe card, first metal kit, carrier device, and conductive wraparound body jointly define an space range, shielding the detection portion and wafer from external noise or interference sources, thereby improving inspection accuracy.

21 Claims, 7 Drawing Sheets

WAFER INSPECTION SYSTEM

CROSS REFERENCE TO RELATED APPLICATION

The application claims priority to Taiwan patent application Serial No. 111214657 filed on Dec. 30, 2022, the entire content of which is incorporated by reference to this application.

BACKGROUND OF THE INVENTION

Field of the Invention

The present disclosure relates to an inspection system for semiconductor devices, and more particularly to a wafer inspection system for wafer inspection.

Description of the Prior Art

The manufacturing process of semiconductor devices includes processes of wafer fabrication and wafer probe. During the processes of wafer probe, a probe procedure is performed on a wafer to be inspected by a probe card. More specifically, a probe of a probe card comes into contact with an electrode point (for example, a solder pad on a die) to input a test signal or a power source to the corresponding die by the probe, so as to perform corresponding electrical inspection items.

However, during the above electrical testing, the accuracy of test results is frequently affected by external noise or interference, leading to errors in the test results.

SUMMARY OF THE INVENTION

A wafer inspection system according to some embodiments of the present disclosure provides shielding against external noise or interference sources, thus achieving a shielding effect.

According to some embodiments, a wafer inspection system includes a carrier device, a probe card, a first metal kit and a surround separating unit. The carrier device includes a carrier unit for placing a wafer to be inspected, wherein the carrier unit is defined with a wafer placement region. The probe card is configured to be opposite to the carrier device and includes a detection portion and a conductive layer surrounding the detection portion and configured at a bottom surface of the probe card. The first metal kit is configured at a bottom portion of the probe card and coupled to the conductive layer and includes a first window and a first ring piece extending from a periphery of the first window, wherein the first window is for the detection portion to extend out. The surround separating unit is configured as an electrically conductive wraparound unit surrounding and laterally enclosing the detection portion and the wafer to be inspected when the probe card performs a probe procedure on the wafer to be inspected.

According to some embodiments, the surround separating unit may be configured on a bottom surface of the first ring piece. During the probe procedure, the surround separating unit abuts against the carrier device, and a first enclosed region is defined jointly by the bottom surface of the probe card, the bottom surface of the first ring piece, a top surface of the carrier device and the surround separating unit.

According to some embodiments, the carrier device may further include a second metal kit. The second metal kit is detachably sleeved on the carrier unit or fixed on the carrier unit. The second metal kit include a second window and a second ring piece extending out from a periphery of the second window, wherein the second window is configured to expose the wafer placement region.

According to some embodiments, the surround separating unit may be configured on a bottom surface of the first ring piece. During the probe procedure, the surround separating unit abuts against the second ring piece, and a second enclosed region is defined jointly by the bottom surface of the probe card, the bottom surface of the first ring piece, a top surface of the second ring piece, a top surface of the carrier device and the surround separating unit.

According to some embodiments, the surround separating unit may be configured on a top surface of the second ring piece. During the probe procedure, the surround separating unit abuts against the first ring piece, and a third enclosed region is defined jointly by the bottom surface of the probe card, the bottom surface of the first ring piece, the top surface of the second ring piece, a top surface of the carrier device and the surround separating unit.

Accordingly, in the wafer inspection system according to some embodiments of the present disclosure, an enclosed region can be established by the electrically conductive surround separating unit in collaboration with the configuration of the first metal kit, the probe card and the carrier unit. The probe procedure of the inspection portion and the wafer to be inspected within this enclosed region can be performed in an environment shielded from external noise or interference sources, thus improving inspection accuracy.

DETAILED DESCRIPTION OF THE EMBODIMENTS

Figure 1:
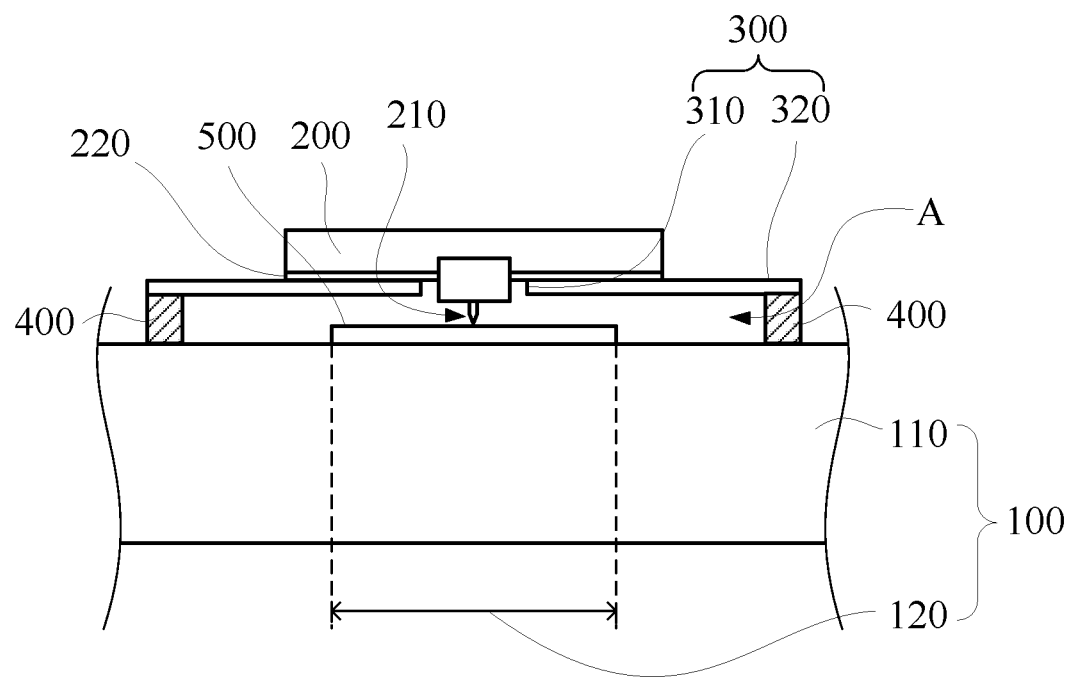
FIG. 1 is a side section schematic diagram of a wafer inspection system during a probe procedure according to some embodiments.

Objectives, features, and advantages of the present disclosure are hereunder illustrated with specific embodiments, depicted with drawings, and described below.

In the disclosure, the term "a/an" or "one" is used to describe an element or a feature. It should be noted that the above is only for better illustration purposes, and to provide general meanings for the scope of the present literature. Unless otherwise specifically pointed out, such description is to be understood as including one or at least one, and an expression in a singular form also includes a plural form.

In the disclosure, the terms "include, comprise and has", and other similar terms are used only for expressing the corresponding elements and features, and intrinsic parts of these elements or features that are not explicitly enumerated are also included.

Ordinal terms such as "first" and "second" used in the present literature are for differentiating or referring to the same or similar elements or features, and do not necessarily imply orders of these elements or features in terms of space. It should be understood that, in certain conditions or arrangements, the ordinal terms can be used in exchange without affecting related embodiments of the present invention.

In the disclosure, the term "coupled" used refers to two or multiple elements or features being directly and physically in contact with each other, or indirectly and physically in contact with each other, or may refer to two or more elements or features operating or acting with each other or directly or indirectly electrically (by electricity or electrical signals) connected to each other.

In the disclosure, spatial terms (for example, above, over, below, under, or the similar" are used to describe the relation of one element feature relative to another (one or more) element(s) or (one or more) features(s). These spatial terms are intended to cover other orientations apart from the orientations of the elements or features depicted in the drawings. These elements or features may be otherwise oriented (for example, rotated by 90 degrees or be oriented otherwise), and the spatial terms used are also to be interpreted according to the re-directed (rotated) orientation.

In the disclosure, these spatial terms cover another (one ore more) element(s) or (one or more) features(s) that may be or may not be configured between these elements or features. For example, in the description below, a first component formed on or above a second component may include an embodiment in which the first component and the second component are formed in a direct contact manner, or may include an embodiment in which an additional component is formed between the first component and the second component in a way that the first component and the second component may not be in direct contact.

Refer to FIG. 1 showing a side section schematic diagram of a wafer inspection system during a probe procedure according to some embodiments. The wafer inspection system includes a carrier device 100, a probe card 200, a first metal kit 300 and a surround separating unit 400.

The carrier device 100 includes a carrier unit 110 for placing a wafer to be inspected 500, and a wafer placement region 120 defined on the carrier unit 110. The carrier unit 110 may be, for example, a combination of a chuck with a suction and attaching function and a carrier tray for carrying wafers, or may be other devices or equipment for securely holding wafers. In the example in FIG. 1, the carrier unit 110 is exemplified by a chuck, and the wafer to be inspected 500 is placed on the chuck for an inspection portion 210 of the probe card 200 above to sequentially establish an electrical conduction path with each die on the wafer to be inspected 500 in a probe procedure, so as to perform related electrical inspection items on each die.

The first metal kit 300 is configured below the probe card 200 and is coupled with a conductive layer 220 on a bottom portion of the probe card 200. The first metal kit 300 includes a first window 310 and a first ring piece 320. The first ring piece 320 extends out from a periphery of the first window 310. The first window 310 is for the inspection portion 210 of the probe card 200 to extend out. The conductive layer 220 configured on a bottom surface of the probe card 200 and a peripheral region of the inspection portion 210 enables the first metal kit 300 in a metal material to form an electrical connection with the probe card 200. More specifically, replacement of the first metal kit 300 having a different size is quite easy, and corresponding replacement may be made according to manufacturing requirements.

Figure 2:
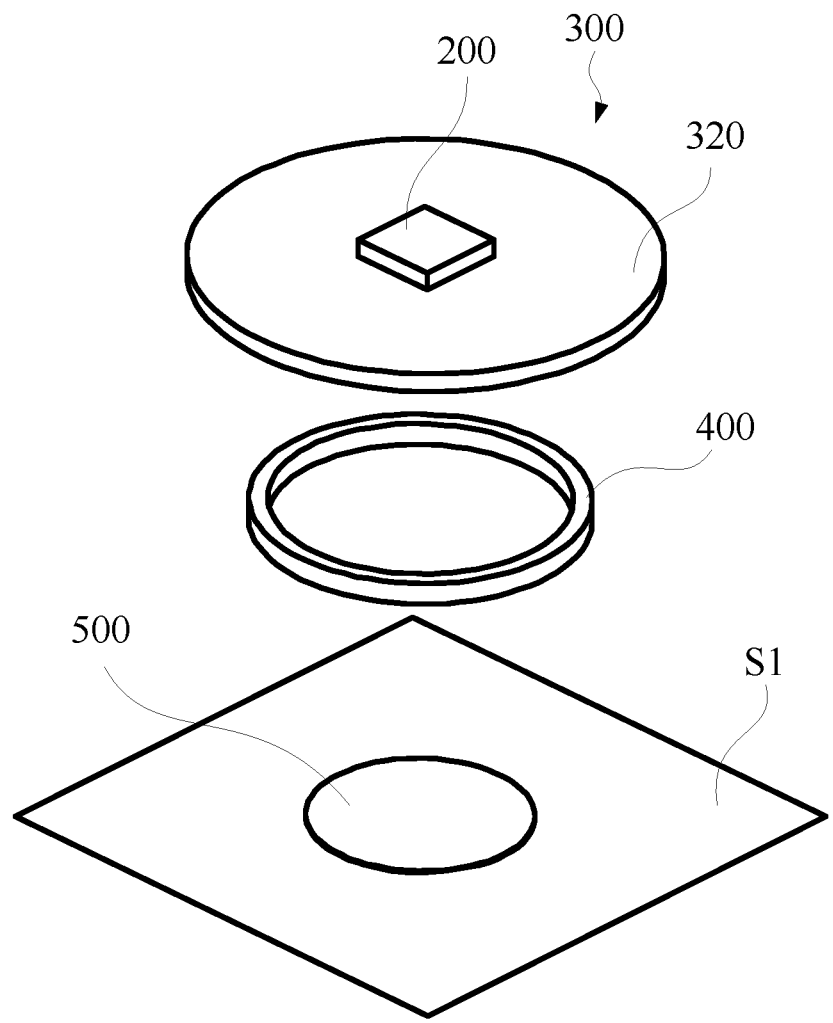
FIG. 2 is a partial exploded schematic diagram of a wafer inspection apparatus according to some embodiments.

Referring to both FIG. 1 and FIG. 2, FIG. 2 shows a partial exploded schematic diagram of a wafer inspection apparatus according to some embodiments. For better illustration purposes, the carrier device 100 is indicated schematically by a carrier surface S1 in FIG. 2. During the probe procedure, on the basis of the approaching (for the inspection portion 210 to come into contact with the dies of the wafer to be inspected 500) between the probe card 200 and the carrier device 100 (carrier surface S1), the surround separating unit 400 at this point is configured to surround between the probe card 200 and the carrier device 100 (carrier surface S1) and laterally enclose a space range A. The surround separating unit 400 serves as an electrically conductive wraparound unit, so that the surround separating unit 400, the probe card 200, the first metal kit 300 and the carrier device 100 jointly define the space range A. For example, the surround separating unit 400 may be an elastic conductive cushion or conductive sponge, which is located at a position between the probe card 200 and the carrier device 100 during the probe procedure, such that the space range A is not in communication with the outside.

Accordingly, in this space range A, with a limiting border constructed by a top surface (the probe card 200 and the conductive layer 220 thereof, and the first metal kit 300), a bottom surface (the carrier device 100 in a conductive metal material) and a periphery (the surround separating unit 400), the space range A becomes an enclosed region, that is, a region of an environment shielded on the basis of metal shielding from external noise and interference sources, thus further improving inspection accuracy of the probe procedure.

Figure 3:
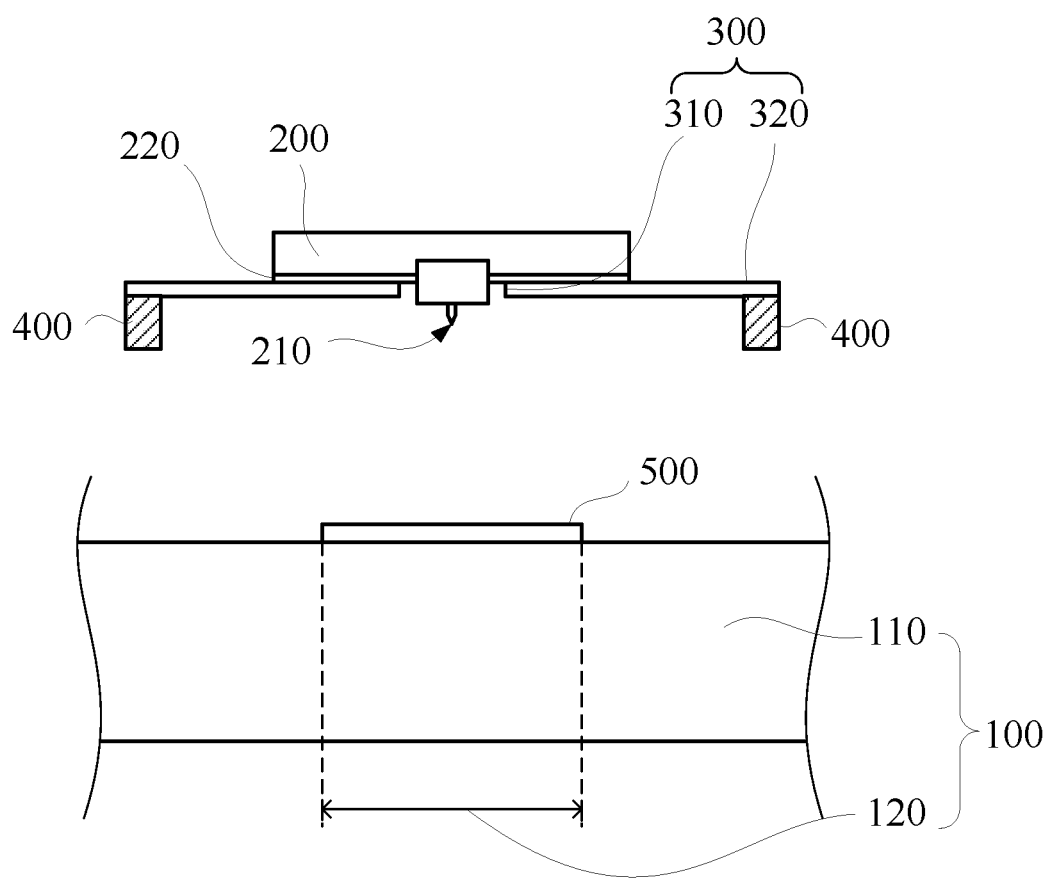
FIG. 3 is a side section schematic diagram of a wafer inspection system in a first implementation form according to some embodiments.

Refer to FIG. 3 showing a side section schematic diagram of a wafer inspection system in a first implementation form according to some embodiments.

The surround separating unit 400 may be configured on a bottom surface of the first ring piece 320 of the first metal kit 300. During the probe procedure, the surround separating unit 400 abuts against the carrier device 100, and a first enclosed region having the space range A (referring to FIG. 1) is defined jointly by the bottom surface of the probe card 200, the bottom surface of the first ring piece 320, a top surface of the carrier device 100 and the surround separating unit 400. On the basis of the electrical conductivity of the conductive layer 220 on the bottom surface of the probe card 200, the first ring piece 320, the top surface of the carrier device 100 and the surround separating unit 400, the first enclosed region achieves the effect of being shielded from external noise or interference sources.

In order to form the first enclosed region during the probe procedure, while the probe card 200 moves relative to the wafer to be inspected 500 to sequentially inspect the dies, the surround separating unit 400 needs to remain abutting against the top surface of the carrier device 100.

As shown in the drawings, on the basis of the extension of the first ring piece 320, edges of the first ring piece 320 of the first metal kit 300 exceed edges of the probe card 200 in the extension direction.

Thus, as an example, the surround separating unit 400 may be configured on edges of a bottom surface of the first ring piece 320, and the length and width formed on an outer periphery by the surround separating unit 400 by means of surrounding may be greater than or equal to twice the diameter of the wafer placement region 120. The length and width of a surface of the carrier device 100 for abutting against the surrounding separating device 400 may be greater than or equal to three times the diameter of the wafer placement region 120. If the surround separating unit 400 has a circular profile, the diameter formed on the outer periphery by the surround separating unit 400 by means of surrounding may be greater than or equal to twice the diameter of the wafer placement region 120, and the diameter of the surface of the carrier device 100 for abutting against the surrounding separating device 400 may be greater than or equal to three times the diameter of the wafer placement region 120.

Figure 4:
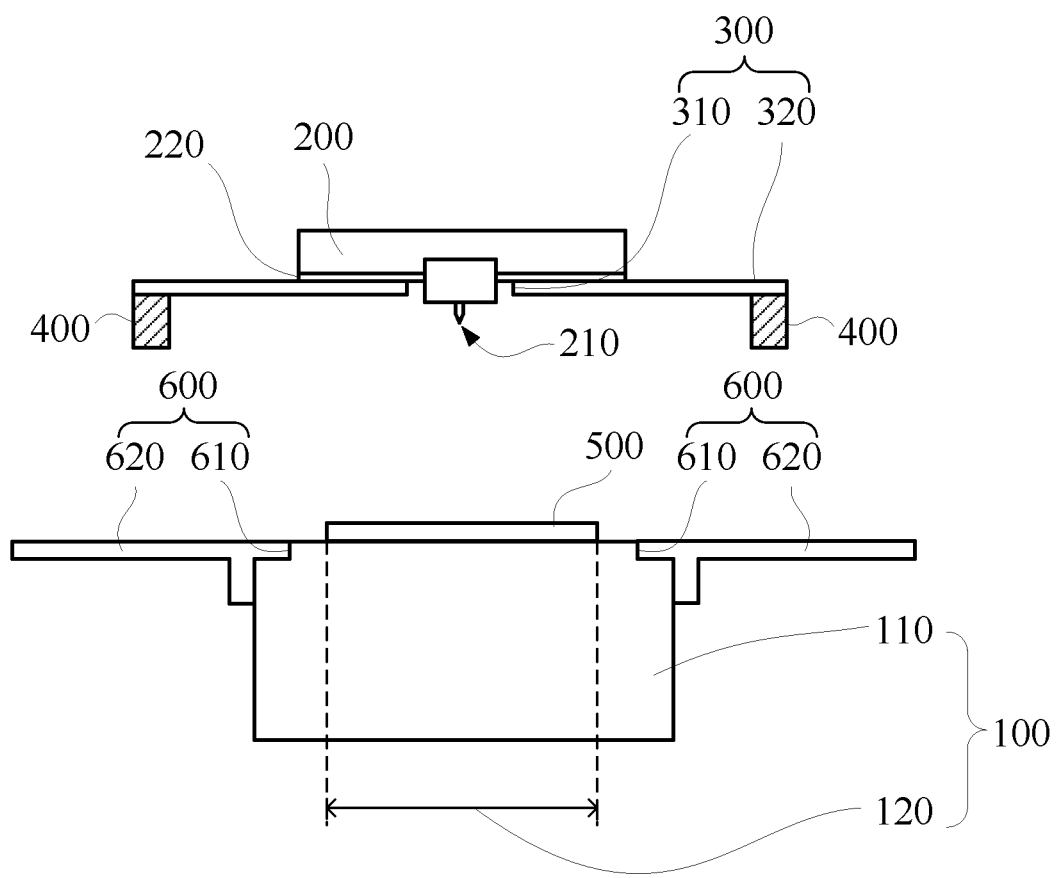
FIG. 4 is a side section schematic diagram of a wafer inspection system in a second implementation form according to some embodiments.
Figure 5:
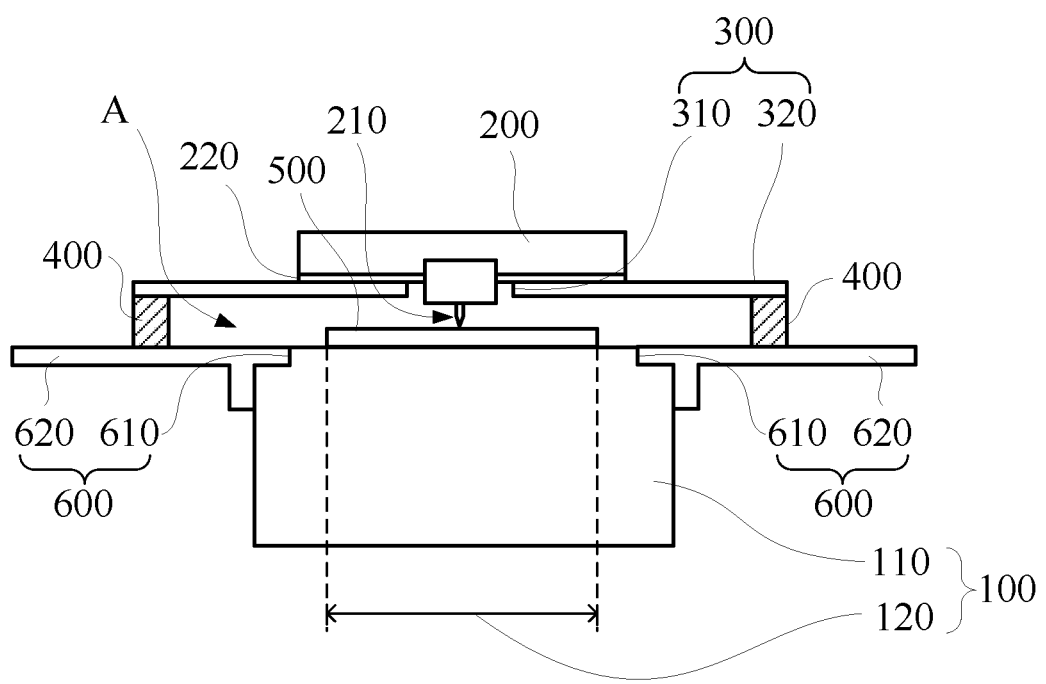
FIG. 5 is another schematic diagram of a wafer inspection system in the second implementation form according to some embodiments.

Referring to FIG. 4 and FIG. 5, FIG. 4 shows a side section schematic diagram of a wafer inspection system in a second implementation form according to some embodiments, and FIG. 5 shows another schematic diagram of a wafer inspection system in the second implementation form according to some embodiments.

The carrier device may further include a second metal kit 600. The second metal kit 600 is detachably sleeved on the carrier unit 110 and includes a second window 610 and a second ring piece 620 extending out from a periphery of the second window 610, wherein the second window 610 is configured to expose the wafer placement region 120.

The surround separating unit 400 is configured on the bottom surface of the first ring piece 320. As shown in FIG. 5, during the probe procedure, the surround separating unit 400 abuts against the second ring piece 620, and a second enclosed region having the space range A is defined jointly by the bottom surface of the probe card 200, the bottom surface of the first ring piece 320, a top surface of the second ring piece 620, the top surface of the carrier device 100 and the surround separating unit 400. Thus, on the basis of the electrical conductivity of the conductive layer 220 on the bottom surface of the probe card 200, the first ring piece 320, the second ring piece 620, the top surface of the carrier device 100 and the surround separating unit 400, the second enclosed region achieves the effect of being shielded from external noise or interference sources.

In the example of this implementation form, the surround separating unit 400 may be configured on the edges of the bottom surfaces of the first ring piece 320, and the length and width formed on the outer periphery by the surround separating unit 400 by means of surrounding may be greater than or equal to twice the diameter of the wafer placement region 120. Moreover, the length and width of the second ring piece 620 of the second metal kit 600 may be greater than or equal to three times the diameter of the wafer placement region 120. If the surround separating unit 400 has a circular profile, the diameter formed on the outer periphery by the surround separating unit 400 by means of surrounding may be greater than or equal to twice the diameter of the wafer placement region 120, and the diameter of the second ring piece 620 of the second metal kit 600 may be greater than or equal to three times the diameter of the wafer placement region 120.

The second metal kit 600 may be detachably sleeved and thus installed on the carrier unit 100, and such additional installation on the carrier device of the wafer inspection system enhances the shielding effect or further expands applicability. However, the present disclosure is not limited to the above example; the second metal kit may also be fixed or directly integrated on the carrier unit.

Figure 6:
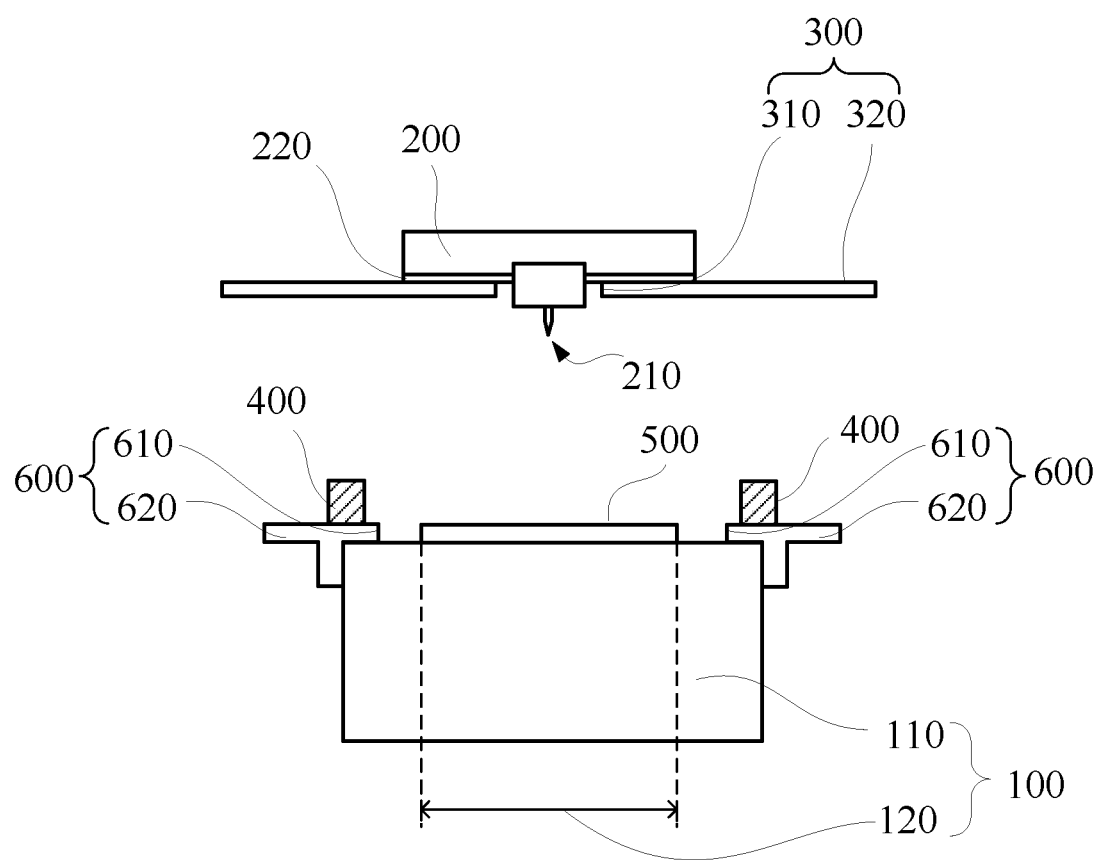
FIG. 6 is a side section schematic diagram of a wafer inspection system in a third implementation form according to some embodiments.
Figure 7:
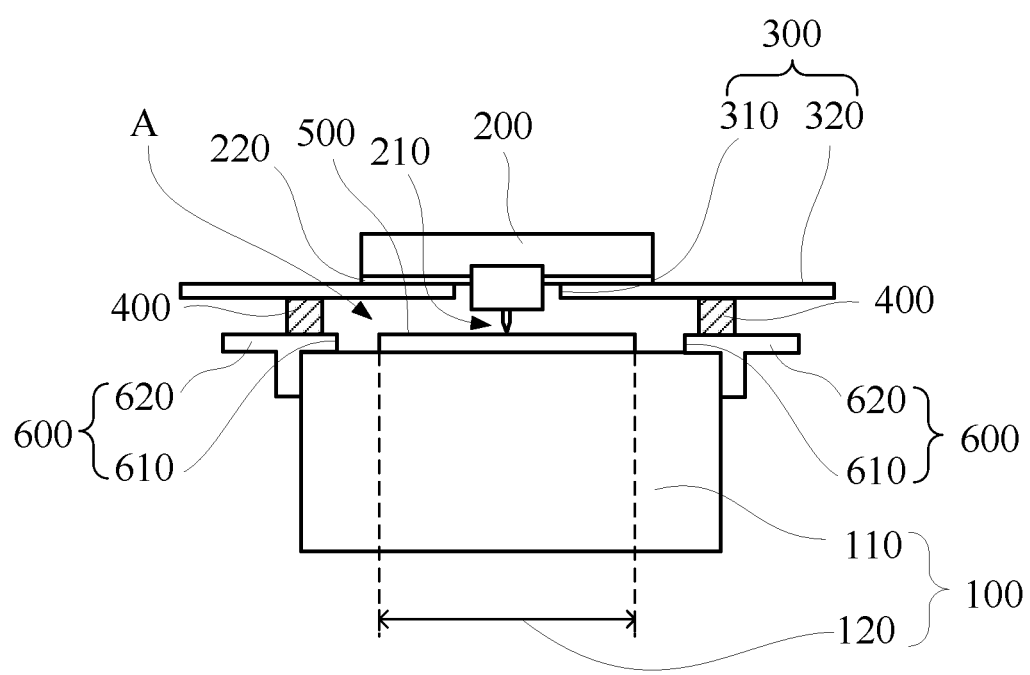
FIG. 7 is another schematic diagram of a wafer inspection system in the third implementation form according to some embodiments.

Referring to FIG. 6 and FIG. 7, FIG. 6 shows a side section schematic diagram of a wafer inspection system in a third implementation form according to some embodiments, and FIG. 7 shows another schematic diagram of a wafer inspection system in the third implementation form according to some embodiments.

The surround separating unit 400 may be configured on a top surface of the second ring piece 620 of the second metal kit 600. During the probe procedure, the surround separating unit 400 abuts against the first ring piece 320 of the first metal kit 300, and a third enclosed region having the space range A is defined jointly by the bottom surface of the probe card 200, the bottom surface of the first ring piece 320, the top surface of the second ring piece 620, the top surface of the carrier device 100 and the surround separating unit 400. Thus, on the basis of the electrical conductivity of the conductive layer 220 on the bottom surface of the probe card 200, the first ring piece 320, the second ring piece 620, the surface of the carrier device 100 and the surround separating unit 400, the third enclosed region achieves the effect of being shielded from external noise or interference sources.

In the example of this implementation form, the surround separating unit 400 may be configured on the top surface of the second ring piece 620 near the wafer placement region 120, that is, the surround separating unit 400 surrounds the wafer placement region 120, and so the length and width formed on the outer periphery by the surround separating unit 400 by means of surrounding may be greater than or equal to the diameter of the wafer placement region 120. Moreover, the length and width of the first ring piece 320 of the first metal kit 300 may be greater than or equal to twice the diameter of the wafer placement region 120. If the surround separating unit 400 has a circular shape, the diameter formed on the outer periphery by the surround separating unit 400 by means of surrounding may be greater than or equal to the diameter of the wafer placement region 120, and the diameter of the first ring piece 320 of the first metal kit 300 may be greater than or equal to twice the diameter of the wafer placement region 120.

In conclusion, in the wafer inspection system according to some embodiments of the present disclosure, an enclosed region can be established by the electrically conductive surround separating unit in collaboration with the configuration of the first metal kit, the probe card and the carrier unit. The probe procedure of the inspection portion and the wafer to be inspected within this enclosed region can be performed in an environment shielded from external noise or interference sources, thus improving inspection accuracy.

The present disclosure is illustrated by various aspects and embodiments. However, persons skilled in the art understand that the various aspects and embodiments are illustrative rather than restrictive of the scope of the present disclosure. After perusing this specification, persons skilled in the art may come up with other aspects and embodiments without departing from the scope of the present disclosure. All equivalent variations and replacements of the aspects and the embodiments must fall within the scope of the present disclosure. Therefore, the scope of the protection of rights of the present disclosure shall be defined by the appended claims.

What is claimed is:
1. A wafer inspection system, comprising:
 a carrier device comprising a carrier unit for placing a wafer to be inspected, wherein the carrier unit is defined with a wafer placement region;
 a probe card configured to be opposite to the carrier device, the probe card comprising a detection portion and a conductive layer surrounding the detection portion and configured at a bottom surface of the probe card;

a first metal kit configured at a bottom portion of the probe card and coupled to the conductive layer, the first metal kit comprising a first window and a first ring piece extending from a periphery of the first window, wherein the first window is for the detection portion to extend out; and a surround separating unit including a conductive wraparound body, wherein during a probe procedure performed by the probe card on the wafer to be tested, the conductive wraparound body surrounds and laterally encloses the detection portion and the wafer to be inspected, and wherein the probe card, the first metal kit, the carrier device and the conductive wraparound body jointly define a space range that is not in communicate with an outside.

2. The wafer inspection system according to claim 1, wherein the surround separating unit is configured on a bottom surface of the first ring piece; during the probe procedure, the surround separating unit abuts against the carrier device, and a first enclosed region is defined jointly by the bottom surface of the probe card, the bottom surface of the first ring piece, a top surface of the carrier device and the surround separating unit.

3. The wafer inspection system according to claim 1, wherein the carrier device further comprises:

a second metal kit detachably sleeved on the carrier unit, the second metal kit comprising a second window and a second ring piece extending out from a periphery of the second window, wherein the second window is configured to expose the wafer placement region.

4. The wafer inspection system according to claim 3, wherein the surround separating unit is configured on a bottom surface of the first ring piece; during the probe procedure, the surround separating unit abuts against the second ring piece, and a second enclosed region is defined jointly by the bottom surface of the probe card, the bottom surface of the first ring piece, a top surface of the second ring piece, a top surface of the carrier device and the surround separating unit.

5. The wafer inspection system according to claim 3, wherein the surround separating unit is configured on a top surface of the second ring piece; during the probe procedure, the surround separating unit abuts against the first ring piece, and a third enclosed region is defined jointly by the bottom surface of the probe card, the bottom surface of the first ring piece, the top surface of the second ring piece, a top surface of the carrier device and the surround separating unit.

6. The wafer inspection system according to claim 1, wherein the carrier device further comprises:

a second metal kit fixed on the carrier unit, the second metal kit comprising a second window and a second ring piece extending out from a periphery of the second window, wherein the second window is configured to accommodate the carrier unit.

7. The wafer inspection system according to claim 6, wherein the surround separating unit is configured on a bottom surface of the first ring piece; during the probe procedure, the surround separating unit abuts against the second ring piece, and a second enclosed region is defined jointly by the bottom surface of the probe card, the bottom surface of the first ring piece, a top surface of the second ring piece, a top surface of the carrier device and the surround separating unit.

8. The wafer inspection system according to claim 6, wherein the surround separating unit is configured on a top surface of the second ring piece; during the probe procedure, the surround separating unit abuts against the first ring piece, and a third enclosed region is defined jointly by the bottom surface of the probe card, the bottom surface of the first ring piece, the top surface of the second ring piece, a top surface of the carrier device and the surround separating unit.

9. The wafer inspection system according to claim 1, wherein the surround separating unit is an elastic conductive cushion or conductive sponge.

10. The wafer inspection system according to claim 1, on the basis of an extension of the first ring piece, edges of the first ring piece of the first metal kit exceed edges of the probe card in an extension direction.

11. The wafer inspection system according to claim 1, wherein the surround separating unit is configured on edges of the bottom surface of the first ring piece.

12. The wafer inspection system according to claim 2, wherein the surround separating unit is configured on edges of the bottom surface of the first ring piece.

13. The wafer inspection system according to claim 3, wherein the surround separating unit is configured on edges of the bottom surface of the first ring piece.

14. The wafer inspection system according to claim 4, wherein the surround separating unit is configured on edges of the bottom surface of the first ring piece.

15. The wafer inspection system according to claim 6, wherein the surround separating unit is configured on edges of the bottom surface of the first ring piece.

16. The wafer inspection system according to claim 7, wherein the surround separating unit is configured on edges of the bottom surface of the first ring piece.

17. The wafer inspection system according to claim 1, wherein the surround separating unit is configured on edges of the top surface of the second ring piece near the wafer placement region.

18. The wafer inspection system according to claim 3, wherein the surround separating unit is configured on edges of the top surface of the second ring piece near the wafer placement region.

19. The wafer inspection system according to claim 5, wherein the surround separating unit is configured on edges of the top surface of the second ring piece near the wafer placement region.

20. The wafer inspection system according to claim 6, wherein the surround separating unit is configured on edges of the top surface of the second ring piece near the wafer placement region.

21. The wafer inspection system according to claim 8, wherein the surround separating unit is configured on edges of the top surface of the second ring piece near the wafer placement region.

* * * * *